United States Patent
Kong et al.

(10) Patent No.: US 6,955,977 B2
(45) Date of Patent: Oct. 18, 2005

(54) SINGLE STEP PENDEO-AND LATERAL EPITAXIAL OVERGROWTH OF GROUP III-NITRIDE EPITAXIAL LAYERS WITH GROUP III-NITRIDE BUFFER LAYER AND RESULTING STRUCTURES

(75) Inventors: Hua-Shuang Kong, Raleigh, NC (US); John Adam Edmond, Cary, NC (US); Kevin Ward Haberern, Cary, NC (US); David Todd Emerson, Durham, NC (US)

(73) Assignee: Cree, Inc., Durham, NC (US)

( * ) Notice: Subject to any disclaimer, the term of this patent is extended or adjusted under 35 U.S.C. 154(b) by 85 days.

(21) Appl. No.: 10/685,597

(22) Filed: Oct. 16, 2003

(65) Prior Publication Data

US 2004/0082150 A1 Apr. 29, 2004

Related U.S. Application Data

(60) Continuation of application No. 10/056,607, filed on Jan. 24, 2002, now Pat. No. 6,764,932, which is a division of application No. 09/679,799, filed on Oct. 5, 2000, now Pat. No. 6,812,053.

(60) Provisional application No. 60/159,299, filed on Oct. 14, 1999.

(51) Int. Cl.[7] ........................ H01L 21/20; H01L 21/36
(52) U.S. Cl. ...................................... 438/481; 438/589
(58) Field of Search ...................... 438/46, 48, 51, 438/589, 604, 606, 607, 653, 687, 481

(56) References Cited

U.S. PATENT DOCUMENTS

| | | | |
|---|---|---|---|
| 4,971,928 A | 11/1990 | Fuller | |
| 5,814,533 A | 9/1998 | Shakuda | |
| 5,962,875 A | 10/1999 | Motoki et al. | |
| 6,051,849 A | 4/2000 | Davis et al. | |
| 6,121,121 A | 9/2000 | Koide | |
| 6,139,629 A | 10/2000 | Kisielowski et al. | |
| 6,153,010 A | 11/2000 | Kiyoku et al. | |
| 6,177,688 B1 * | 1/2001 | Linthicum et al. | ............ 257/77 |
| 6,413,627 B1 * | 7/2002 | Motoki et al. | .............. 428/332 |

FOREIGN PATENT DOCUMENTS

| | | |
|---|---|---|
| CA | 2258080 A1 | 4/1998 |
| CN | 1258094 | 6/2000 |
| EP | 0 942 459 A1 | 9/1999 |

(Continued)

OTHER PUBLICATIONS

Davis, et al., "Pendeo–epitaxial Growth and Characterization of GaN and Related Materials on 6H–SiC(0001) and Si(111) Substrates", Department of Materials Science and Engineering, North Carolina state Unversity, F99W2.1.

(Continued)

Primary Examiner—Phuc T. Dang
(74) Attorney, Agent, or Firm—Summa & Allan, P.A.

(57) ABSTRACT

A method of fabricating a gallium nitride-based semiconductor structure on a substrate includes the steps of forming a mask having at least one opening therein directly on the substrate, growing a buffer layer through the opening, and growing a layer of gallium nitride upwardly from the buffer layer and laterally across the mask. During growth of the gallium nitride from the mask, the vertical and horizontal growth rates of the gallium nitride layer are maintained at rates sufficient to prevent polycrystalline material nucleating on said mask from interrupting the lateral growth of the gallium nitride layer. In an alternative embodiment, the method includes forming at least one raised portion defining adjacent trenches in the substrate and forming a mask on the substrate, the mask having at least one opening over the upper surface of the raised portion. A buffer layer may be grown from the upper surface of the raised portion. The gallium nitride layer is then grown laterally by pendeoepitaxy over the trenches.

40 Claims, 14 Drawing Sheets

FOREIGN PATENT DOCUMENTS

| | | |
|---|---|---|
| EP | 1041610 A1 | 4/2000 |
| EP | 1 005 067 A2 | 5/2000 |
| JP | 07-273387 | 10/1995 |
| JP | 9-093315 | 4/1997 |
| JP | 9-174494 | 6/1997 |
| JP | 9-201477 | 7/1997 |
| JP | 9-277448 | 10/1997 |
| JP | 9-290098 | 10/1997 |
| JP | 9-324997 | 11/1997 |
| JP | 10312971 | 11/1998 |
| JP | 11-191657 | 7/1999 |
| WO | WO 98/47140 | 10/1998 |
| WO | WO 99/18617 | 4/1999 |
| WO | WO 99/23693 A | 5/1999 |
| WO | WO 99/65068 | 12/1999 |
| WO | WO 00/31783 | 6/2000 |
| WO | WO 00/33365 | 6/2000 |

OTHER PUBLICATIONS

Gehrke et al., "Pendeo–Epitaxy of Gallium nitride and Aluminum Nitride Films and Heterostructures on Silicon Carbide Substrate", MRS Internet Journal Nitride Semiconductor Research 4S1, G3.2, 1999.

Kato, et al., "Selective growth of wurtzite GaN and $Al_xGa_{1-x}N$ on GaN/sapphire substrates by metalorganic vapor phase epitaxy", Journal of Crystal Growth 144, 1994, 133–140.

Kawaguchi et al., "Selective Area Growth (SAG) and Epitaxial Lateral Overgrowth (ELO) of GaN Using Tungsten Mask", MRS Internet Journal Nitride Semiconductor Research 451, 1999.

"LEO Unmasked by Pendeo–Epitaxy", Compound Semiconductor, Mar. 1999, p. 16.

Marchand et al., "Structural and optical properties of GaN laterally overgrown on Si(111) by metalorganic chemical vapor deposition using an AlN buffer layer", MRS Internet Journal Nitride Semiconductor Research 4, 2, 1999.

Nakamura et al., "High–Power, Long–Llifetime InGaN/GaN/AlGaN–Based Laser Diodes Grown on Pure GaN Substrates", Japanese Journal of Applied Physics, 1998, vol. 37, Pt. 2, No. 3B.

Nakamura, "InGaN/GaN/AlGaN–based laser diodes", Properties, Processing and Applications of Gallium Nitride and Related Semiconductors C5.1, Jun. 1998, pp. 587–595.

Nakamura et al., "InGaN/GaN/AlGaN–Based Laser Diodes Grown on GaN Substrates with a Fundamental Transverse Mode", Japanese Journal of Applied Physics, 1998, vol. 37, Pt. 2, No. 9A/B.

Nakamura et al, "InGaN/GaN/AlGaN–Based Laser Diodes with Modulation–Doped Strained–Layer Superlattices", Japanese Journal of Applied Physics, 1997, vol. 38, Pt. 2, No. 12A.

Shealy et al., "Single Step Process for Epitaxial Lateral Overgrowth of GaN", The Heterogeneous Optoelectronics Technology Center: Quarterly Report, p. 9.

Smart, et al., "Single step process for epitaxial lateral overgrowth of GaN on SiC and sapphire substrates", Applied Physics Letters, vol. 75, No. 24; Dec. 1999, pp. 3820–3822.

Dupuis, R.D. et al., Selective–area and lateral epitaxial overgrowth of III–N materials by metalorganic chemical vapor deposition; Journal of Crystal Growth, vol. 195, No. 1–4, Dec. 1998, pp. 340–345.

Kung, P. et al., Lateral epitaxial overgrowth of GaN films on sapphire and silicon substrates, Applied Physics Letters, vol. 74, No. 4, Jan. 25, 1999, pp. 570–572.

Zheleva, T.S. et al., Pendeo–epitaxy—A new approach for lateral growth of gallium nitride structures, MRS Internet Journal of Nitride Semiconductor Research, 1999, vol. 451, No. G3.38, Nov. 30, 1998–Dec. 4, 1998.

Marx, D. et al., Selective area growth of GaN/AlN heterostructures, Journal of Crystal Growth, vol. 189–190, Jun. 1998, pp. 87–91.

Smart, et al., "AlGaN/GaN Heterostructures on Insulating AlGaN Nucleation Layers", Applied Physics Letters, Jul. 1999, vol. 75, No. 3.

Kidoguchi, I. et al., Improvement of crystalline quality in GaN films by air–bridged lateral epitaxial growth, Japanese Journal of Applied Physics, Part 2 (Letters), vol. 39, No. 58, May 15, 2000, pp. L453–L453.

Usui et al., "Thick GaN Epitaxial Growth with Low Dislocation Density by Hydride Vapor Phase Epitaxy", Japanese Journal of Applied Physics, 1997, vol. 36, Pt. 2, No. 7B.

\* cited by examiner

SINGLE STEP PENDEO-AND LATERAL EPITAXIAL OVERGROWTH OF GROUP III-NITRIDE EPITAXIAL LAYERS WITH GROUP III-NITRIDE BUFFER LAYER AND RESULTING STRUCTURES

CROSS-REFERENCE TO RELATED APPLICATIONS

This application is a continuation of U.S. application Ser. No. 10/056,607, filed Jan. 24, 2002, now U.S. Pat. No. 6,764,932 which in turn is a divisional of U.S. application Ser. No. 09/679,799, filed Oct. 5, 2000, now U.S. Pat. No. 6,812,053, which claims benefit of Provisional U.S. Application No. 60/159,299 filed on Oct. 14, 1999.

FIELD OF THE INVENTION

The present invention relates to electronic device structures and fabrication methods, and more particularly to Group III-nitride semiconductor structures and methods of fabrication by pendeo- and lateral epitaxial overgrowth.

BACKGROUND

Gallium nitride (GaN) is a wide-bandgap semiconductor material widely known for its usefulness as an active layer in blue light emitting diodes. GaN is also under investigation for use in other microelectronic devices including laser diodes and high-speed, high power transistor devices. As used herein, "gallium nitride" or "GaN" refers to gallium nitride and III-nitride alloys thereof, including aluminum gallium nitride (AlGaN), indium gallium nitride (InGaN) and aluminum indium gallium nitride (AlInGaN).

High-quality bulk crystals of GaN are currently unavailable for commercial use. Thus, GaN crystals are typically fabricated as heteroepitaxial layers on underlying non-GaN substrates. Unfortunately, GaN has a considerable lattice mismatch with most suitable substrate crystals. For example, GaN has a 15% lattice mismatch with sapphire and a 3.5% lattice mismatch with silicon carbide. Lattice mismatches between a substrate and an epitaxial layer cause threading dislocations which may propagate through the growing epitaxial layer. Even when grown on silicon carbide with an aluminum nitride buffer layer, a GaN epitaxial layer exhibits dislocation densities estimated to be in excess of $10^8/cm^2$. Such defect densities limit the usefulness of GaN in highly sensitive electronic devices such as laser diodes.

Lateral Epitaxial Overgrowth (LEO) of GaN has been the subject of considerable interest since it was first introduced as a method of reducing the dislocation densities of epitaxially grown GaN films. Essentially, the technique consists of masking an underlying layer of GaN with a mask having a pattern of openings and growing the GaN up through and laterally onto the mask. It was found that the portion of the GaN layer grown laterally over the mask exhibits a much lower dislocation density than the underlying GaN layer or the portion of the GaN layer above the mask openings. As used herein, "lateral" or "horizontal" refers to a direction generally parallel to the surface of a substrate, while the term "vertical" means a direction generally orthogonal to the surface of a substrate.

One drawback to conventional LEO techniques is that separate process steps are required for growing the underlying GaN layer, masking the GaN layer and then growing the lateral layer. Early embodiments of LEO did not place the mask directly on the non-GaN substrate because unwanted nucleation would occur on the mask during nucleation of the GaN layer at low temperatures, preventing adjacent laterally-grown regions from coalescing (or otherwise from growing laterally a desired distance if coalescence is not required). When the mask is placed directly on a GaN layer, unwanted nucleation on the mask is typically not a problem since low temperature nucleation is not required and the growth temperature of GaN is very high, typically above 1000° C. During high temperature growth, unwanted nucleation does not occur on the mask due to the much higher sticking coefficient of gallium atoms on the gallium nitride surface as compared to the mask.

This drawback is addressed with some success by a "single step" process for LEO. Shealy et al. disclosed a process whereby an underlying SiC or sapphire substrate was masked with silicon nitride. The process is referred to as "single step" because it does not require growth of an intermediate layer of GaN between the substrate and the mask. Shealy found that minimizing nucleation on the silicon nitride mask permitted growth of a relatively defect free layer of laterally-grown GaN over the masks. However, under certain circumstances it is desirable to avoid having to minimize nucleation on the mask, yet still be able to grow a relatively defect free layer of GaN in a single step process.

OBJECT AND SUMMARY OF THE INVENTION

Accordingly, there is a need in the art for a method of fabricating a relatively defect-free single crystal film of gallium nitride in a single step process without having to minimize nucleation on the mask layer.

Moreover, there is a need in the art for a method of fabricating a relatively defect-free single crystal film of gallium nitride in a single step process without having to minimize nucleation on the mask layer which provides a conductive buffer layer to permit electrical communication between a conductive substrate and an epitaxial layer of gallium nitride.

It is an object of the present invention to provide a method of fabricating a relatively defect-free single crystal film of gallium nitride in a single step process without having to minimize nucleation on the mask layer.

It is a further object of the present invention to provide a method of fabricating a relatively defect-free single crystal film of gallium nitride in a single step process without having to minimize nucleation on the mask layer which provides a conductive buffer layer to permit electrical communication between a conductive substrate and an epitaxial layer of gallium nitride.

The foregoing and other objects are achieved by a method of fabricating a gallium nitride-based semiconductor structure on a substrate. The method includes the steps of forming a mask having at least one opening therein directly on the substrate, growing a buffer layer through said at least one opening, and growing a layer of gallium nitride upwardly from said buffer layer and laterally across said mask. During growth of the gallium nitride from the mask, the vertical and horizontal growth rates of the gallium nitride layer are maintained at rates sufficient to prevent polycrystalline material nucleating on said mask from interrupting the lateral growth of the gallium nitride layer.

In an alternative embodiment, the method includes forming at least one raised portion defining adjacent trenches in the substrate and forming a mask on the substrate, the mask having at least one opening over the upper surface of the raised portion. A buffer layer may be grown from the upper surface of the raised portion. The gallium nitride layer is then grown laterally by pendeoepitaxy over the trenches.

In another embodiment, the present invention provides a gallium nitride-based semiconductor structure on a substrate. The structure includes a substrate and a mask having at least one window therein applied directly on the upper surface of the substrate. An overgrown layer of gallium nitride extends upwardly from the mask window and laterally across the mask, on which polycrystalline material has nucleated and grown.

In another embodiment, the substrate includes at least one raised portion defining adjacent trenches. A mask structure overlays the substrate and a window in the mask exposes at least a portion of the upper surface of the raised portion. An overgrown layer of gallium nitride extends upwardly from the mask window and laterally over the trench and across the mask, on which polycrystalline material has nucleated and grown.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, references herein to a layer formed "on" a substrate or other layer may refer to the layer formed directly on the substrate or other layer or on an intervening layer or layers formed on the substrate or other layer. References herein to a layer formed "directly on" a substrate or other layer refer to the layer formed on the substrate without an intervening layer or layers formed on the substrate or other layer. The present invention is not limited to the relative size and spacing illustrated in the accompanying figures.

Basic LEO techniques are described in A. Usui, et al., "Thick GaN epitaxial growth with low dislocation density by hydride vapor phase epitaxy," Jpn. J. Appl. Phys. Vol. 36, pp. L899–902 (1997). Various LEO techniques including pendeoepitaxial techniques are described in U.S. application Ser. No. 09/032,190 "Gallium Nitride Semiconductor Structures Including a Lateral Gallium Nitride Layer that Extends From an Underlying Gallium Nitride Layer", filed Feb. 27, 1998; application Ser. No. 09/031,843 "Gallium Nitride Semiconductor Structures Including Laterally Offset Patterned Layers", filed Feb. 27, 1998; application Ser. No. 09/198,784, "Pendeoepitaxial Methods of Fabricating Gallium Nitride Semiconductor Layers on Silicon Carbide Substrates by Lateral Growth from Sidewalls of Masked Posts, and Gallium Nitride Semiconductor Structures Fabricated Thereby" filed Nov. 24, 1998; and application Ser. No. 60/088,761 "Methods of Fabricating Gallium Nitride Semiconductor Layers by Lateral Growth from Sidewalls into Trenches, and Gallium Nitride Semiconductor Structures Fabricated Thereby," filed Jun. 10, 1998, the disclosures of each of which are hereby incorporated herein by reference.

Figure 1:
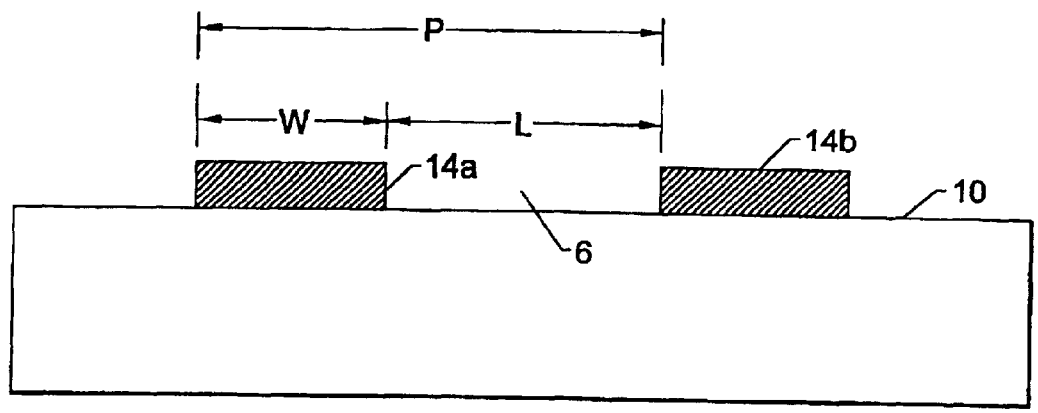
FIG. 1 is a cross-section of a substrate on which a mask has been patterned.

Referring now to FIG. 1, a substrate 10 is illustrated on which is deposited a mask layer 14 comprising stripes 14a and 14b. Although the stripe pattern may continue in a periodic or aperiodic fashion on either side, for convenience only stripes 14a and 14b are illustrated. Stripes 14a, 14b are characterized in that they have a width (w) and are separated by mask openings or windows 6 having a window length (l). The distance between an edge of stripe 14a and the corresponding edge of stripe 14b is defined as the period (p) of the mask pattern, at least with respect to stripes 14a and 14b, such that p=w+1.

The mask layer may be deposited using plasma enhanced chemical vapor deposition (PECVD), sputtering, electron-beam deposition, thermal oxidation or other deposition techniques, and patterned using standard photolithographic techniques. The PECVD process is described in detail in Chapter 6 of S. M. Sze, *VLSI Technology*, 2nd ed., McGraw-Hill 1988. Photolithographic techniques are well known in the art.

Figure 2:
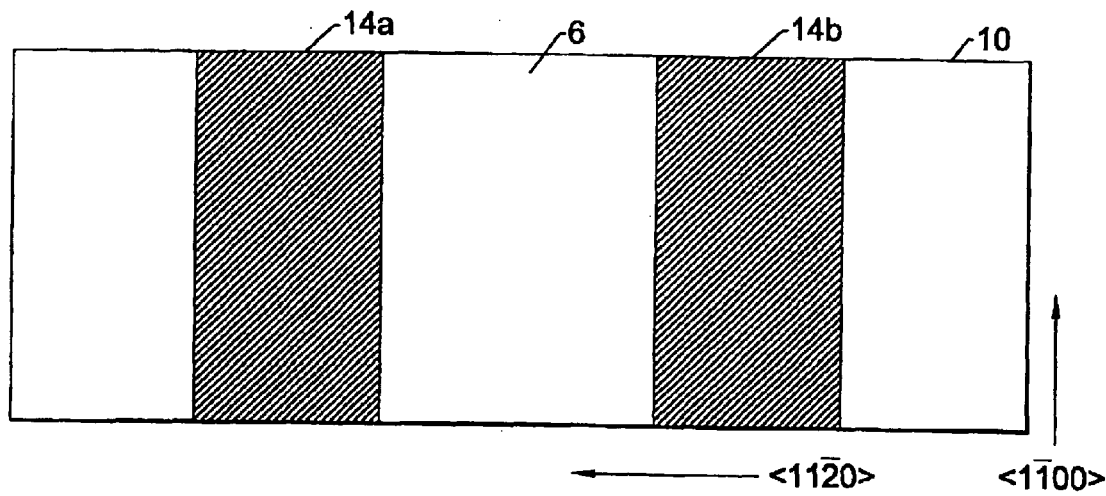
FIG. 2 is a plan view of a substrate on which a mask has been patterned.

As illustrated in FIG. 2, stripes 14a and 14b are preferably oriented along the <1$\bar{1}$00> crystallographic direction in the (0001) plane. (Crystallographic designation conventions used herein are well known in the art and need not be described further.) The mask layer 14 may comprise silicon nitride ($Si_xN_y$) or silicon dioxide ($SiO_2$) or any other suitable mask material. If the structure being fabricated is intended for use in an optical device such as an LED or laser diode, the mask layer 14 may comprise a reflective or refractory metal which is stable in ammonia and hydrogen gas, has a melting point in excess of about 1200° C., and is reflective to the desired wavelength. Examples of such metals include tungsten (W) and platinum (Pt). Alternatively, the mask layer could comprise a Bragg reflector which may comprise alternating layers of $Si_xN_y$ and $SiO_2$ or other oxides, the design of which is well known in the art.

The substrate may be silicon carbide, sapphire ($Al_2O_3$), silicon, ZnO, or any other similarly suitable substrate. Silicon carbide substrates are advantageous for a number of reasons. Silicon carbide provides closer lattice and thermal expansion matches for GaN, is thermally and chemically stable, has natural cleave planes, high thermal conductivity, and is transparent to visible wavelengths up to 380 nm. Also, silicon carbide has a distinct advantage in that it is conductive, which permits fabrication of vertical-geometry devices. Silicon carbide substrates may have a polytype of 4H, 6H, 3C or 15R. Preferably, however, the substrate is 6H—SiC (on-axis).

The fabrication of substrate 10 is well known to those in the art. Fabrication of silicon carbide substrates are described, for example, in U.S. Pat. No. 4,865,685 to Palmour et al., Re34,861 to Davis, et al., U.S. Pat. No. 4,912,064 to Kong et al., and U.S. Pat. No. 4,946,547 to Palmour et al., the disclosures of each of which are hereby incorporated by reference. The fabrication of sapphire and silicon substrates is well known in the art and need not be described in detail.

Figure 3:
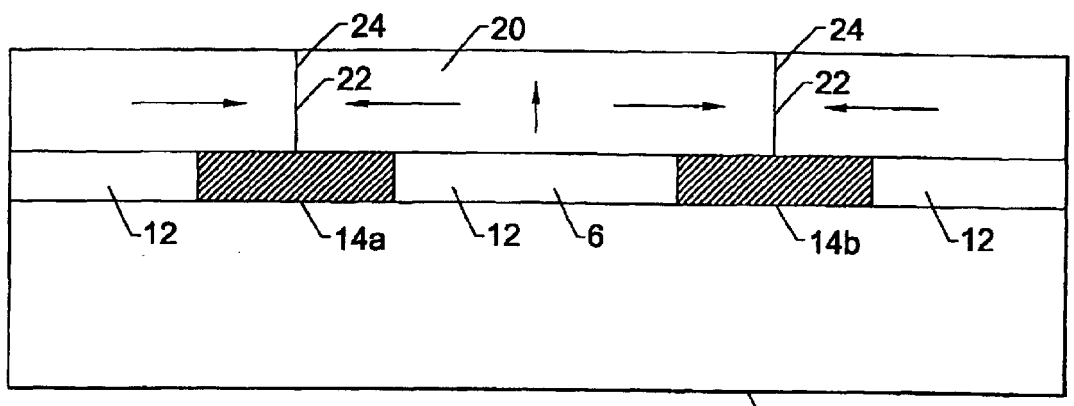
FIG. 3 is a cross section of a substrate on which a layer of GaN has been epitaxially grown by LEO on a conductive buffer layer.

Referring now to FIG. 3, an epitaxial layer 20 may be fabricated by first growing a buffer layer 12 on the surface of the substrate 10. Epitaxial layer 20 may comprise gallium nitride or a Group III-nitride alloy thereof, such as aluminum gallium nitride (AlGaN), indium gallium nitride (InGaN), or aluminum indium gallium nitride (AlInGaN). For a SiC substrate, the buffer layer preferably comprises a layer 12 of $Al_xGa_{1-x}N$, where x represents the mole fraction of aluminum present in the alloy and $0<x\leq 1$. In the case of silicon carbide substrates, the buffer layer 12 may have the structure described in copending and commonly assigned U.S. patent application Ser. No. 08/944,547 entitled "Group III Nitride Photonic Devices on Silicon Carbide Substrates with Conductive Buffer Interlayer Structure," filed Oct. 7, 1997, the disclosure of which is hereby incorporated herein by reference.

Preferably, the topmost buffer layer comprises a mole percentage of Al of between 9% and 12%, and is approximately 1000 to 5000 Å thick. The buffer layer 12 may be made conductive to the SiC substrate by the formation of capped GaN dots on the SiC substrate as described in U.S. patent application Ser. No. 08/944,547 prior to the deposition of the buffer layer.

For sapphire or silicon substrates, a low temperature GaN, AlN or AlGaN buffer may be grown.

As shown in FIG. 3, an AlGaN buffer layer 12 may be grown vertically from the mask openings 6 using a vapor phase epitaxy (VPE) technique such as hydride vapor phase epitaxy (HVPE), or more preferably metal-organic vapor phase epitaxy (MOVPE). In a preferred embodiment, the buffer layer 12 is grown to a thickness larger than the thickness of the mask layer 14. Once the buffer layer 12 has been grown to a desired thickness, the epitaxial layer 20 is then grown by VPE, preferably in the same run or step as the buffer layer was grown.

Figure 3A:
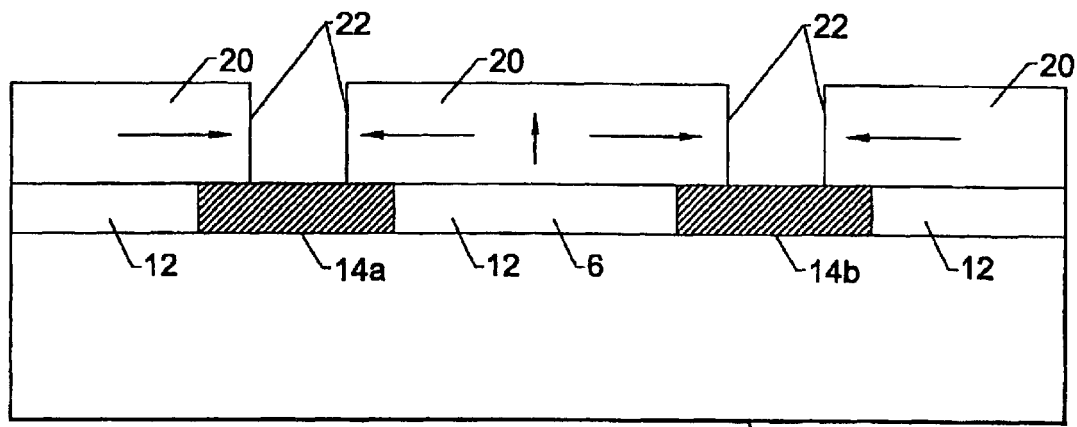
FIG. 3A is a cross section of a substrate on which a layer of GaN is being epitaxially grown by LEO on a conductive buffer layer, but has not coalesced.

As shown in FIG. 3A, epitaxial layer 20 grows laterally (i.e. parallel to the face of the substrate) in addition to vertically. Lateral growth fronts 22 move across the surface of the mask stripes 14 as layer 20 grows.

Figure 9:
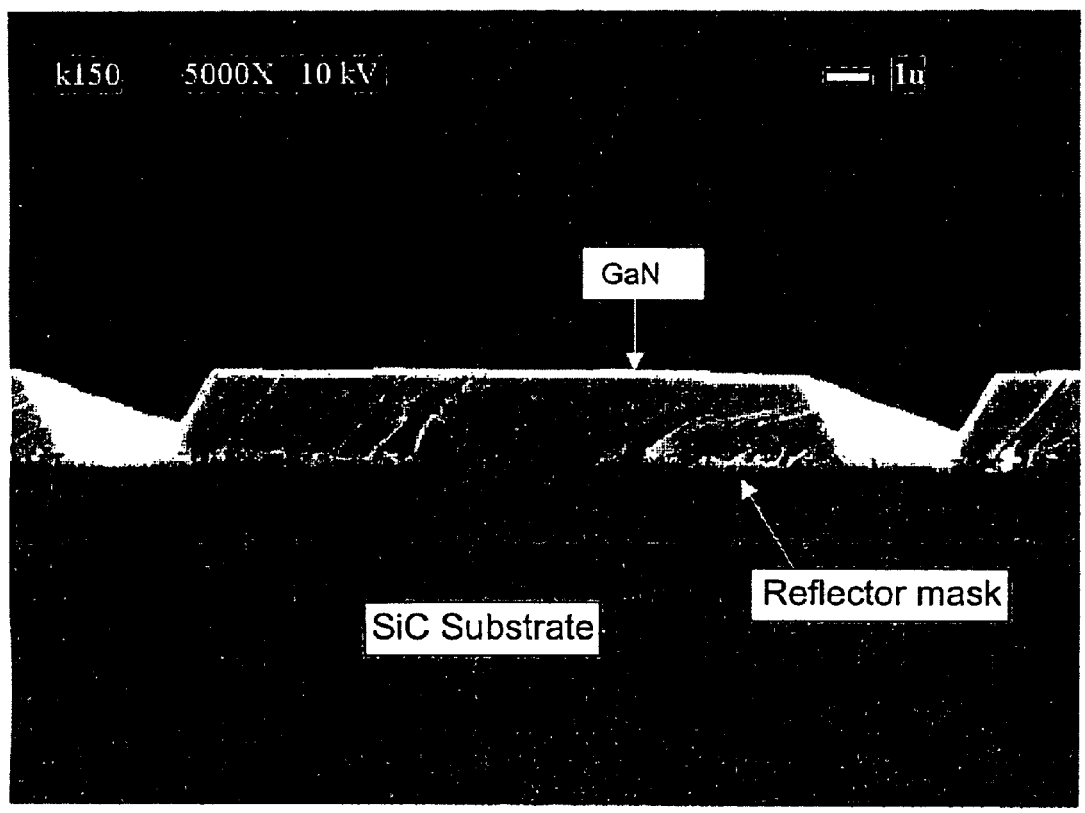
FIG. 9 is a cross-sectional SEM of GaN stripes grown in accordance with an embodiment of the present invention using a reflective mask layer.

Referring again to FIG. 3, in one embodiment, epitaxial layer 20 grows laterally until the growth fronts 22 coalesce at interfaces 24 to form a continuous layer 20 of gallium nitride. However, it is not necessary for the growth fronts to coalesce for all applications, as it is possible to fabricate devices in laterally overgrown portions of GaN even if they have not coalesced with adjacent portions. As illustrated in FIG. 9, a useful portion of layer 20 may be fabricated without coalescence of adjacent portions. For example, a laser diode stripe may be fabricated in a region of layer 20 that has not coalesced. For fabrication of an LED, a coalesced layer is preferred. For example, an LED device 250μ wide and 275μ long may be fabricated on a coalesced layer of gallium nitride grown in accordance with the present invention.

The buffer layer 12 and the overgrown layer 20 may be grown using trimethylgallium (TMG), trimethylaluminum (TMA) and ammonia ($NH_3$) precursors in a diluent of $H_2$. A suitable MOVPE growth technique is described in greater detail in T. Weeks et al., "*GaN thin films deposited via organometallic vapor phase epitaxy on a(6H)—SiC(0001) using high-temperature monocrystalline AlN buffer layers,*" Appl. Phys. Let., Vol. 67, No. 3, July 1995, pp. 401–403.

Figure 4:
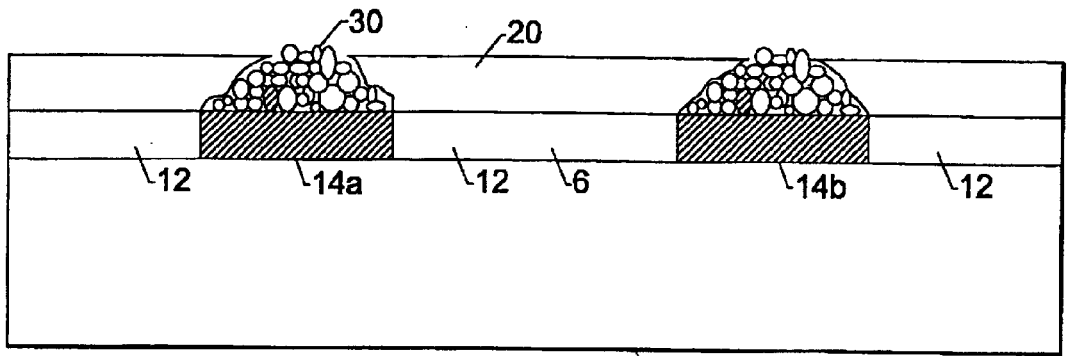
FIG. 4 is a cross section of a substrate on which excessive nucleation on the mask has interrupted the lateral growth of a layer of GaN.

While the layer 20 of gallium nitride is growing, nucleation and growth of polycrystalline $Al_xGa_{1-x}N$ 30 typically begins to occur on the exposed upper surfaces of mask stripes 14. As illustrated in FIG. 4, if the growth rate of $Al_xGa_{1-x}N$ on the masks is too high, the lateral growth of layer 20 will be interrupted, preventing it from forming a desired width of laterally overgrown material, and/or preventing it from coalescing with adjacent regions. Essentially, the polycrystalline $Al_xGa_{1-x}N$ 30 on the mask grows vertically and blocks the lateral growth of the single crystal layer 20.

The present inventors have discovered that it is possible, by controlling the horizontal and vertical growth rates of layer 20, to avoid interruption of the laterally growing layer 20 by the polycrystalline $Al_xGa_{1-x}N$ 30. By increasing the lateral growth rate of layer 20 relative to its vertical growth rate by a given amount depending on the geometry of the structure, it is possible to grow a layer 20 that will grow to a desired distance despite nucleation on the mask.

Stated differently, by maintaining a sufficiently high lateral growth rate relative to the vertical growth rate of layer 20, nucleation on the mask need not be controlled, since layer 20 will overgrow any polycrystalline nucleation and growth on the mask.

Figure 5:
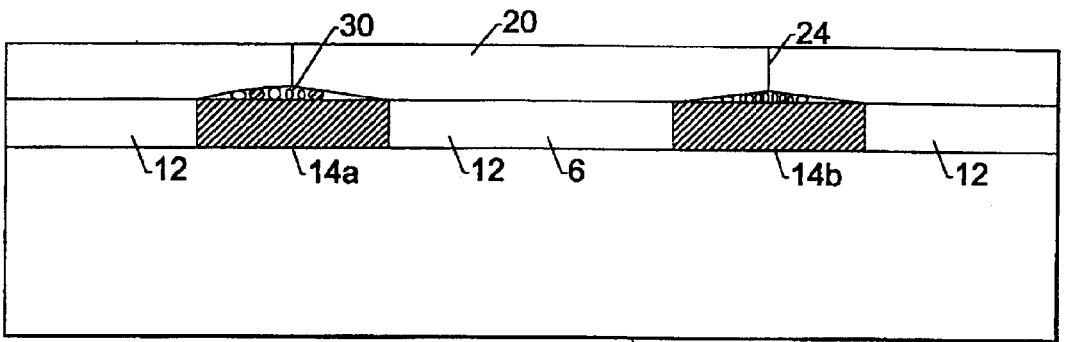
FIG. 5 is a cross section of a substrate on which a layer of GaN has been epitaxially grown in accordance with an aspect of the present invention.

As a particular example, it has been discovered that by maintaining a ratio of lateral growth rate to vertical growth rate of at least 1:1, it is possible to grow a laterally-overgrown GaN layer on a stripe having a width of $5\mu$ in a pattern with a period of $30\mu$ from a nucleation layer having an Al concentration of about 10%. By maintaining a lateral/vertical growth ratio of 4:1, it is possible to grow a layer of GaN over a mask having $25\mu$-wide stripes. As shown in FIG. 5, when the lateral growth rate is caused to exceed the vertical growth rate by a sufficient amount, the growth fronts of the layer 20 may coalesce before the polycrystalline AlGaN growing on the stripes 14a,b grow large enough to block them.

The mechanisms for controlling the relevant growth factors will now be described in detail. The lateral and vertical growth rates of the overgrown layer 20 are controlled by a number of factors. One controlling factor is the so called "fill factor", defined herein as the ratio of the window length (l) to the stripe period (p). For a given window length, a higher fill factor (i.e. a larger window length for a given period) results in a slower vertical growth rate. Conversely, for a given window length, a lower fill factor results in an increased vertical growth rate. Other factors for controlling the lateral and vertical growth rates are growth temperature, source gas flow rates, source gas nitrogen/gallium ratio, and growth pressure.

If desired, once the laterally growing growth fronts 22 of the layer 20 have coalesced over the masks, the growth conditions can be adjusted to increase the vertical growth rate.

Although dependent on the structure of the particular epitaxial growth reactor being employed, typical growth parameters for the rates described herein are summarized in the following table.

TABLE 1

Typical growth parameters.

| Parameter | Value |
|---|---|
| Growth temperature | 1060–1120° C. |
| Growth pressure | 50–200 Torr |
| N/Ga ratio | 2500 |
| Fill factor | 0.714–0.833 |
| Lateral growth rate/vertical growth rate | 1–4.2 |

Preferably, a lateral growth rate of about 2–8 $\mu$/hr and a vertical growth rate of about 1–2 $\mu$/hr should be selected. A lateral growth rate of 6.3 $\mu$/hr and a vertical growth rate of 1.5 $\mu$/hr (4.2:1 ratio) may be achieved by growing the layer 20 by MOVPE at 1110° C. and 200 Torr on a patterned mask of $Si_xN_y$ stripes having a stripe width of $10\mu$, a window width of $25\mu$ and a period of $35\mu$ for a fill factor of 0.71. The N/Ga ratio during growth of the layer 20 is preferably about 2500. Ratios of lateral growth rate to vertical growth rate may exceed 4.2:1.

To grow the buffer layer, TMG may flowed at 34.8 $\mu$mol/min, TMA may be flowed at 6.5 $\mu$mol/min and ammonia may be flowed at a rate of 10 slpm in a diluent of $H_2$ at 15.5 slpm. Once the buffer layer has been grown to a desired thickness, the layer 20 may be grown by flowing TMG at 309 $\mu$mol/min and ammonia at a rate of 17 slpm in a diluent of $H_2$ at 22.5 slpm until the GaN layer has grown to a desired thickness.

A lateral and vertical growth rate of 4.2 $\mu$/hr (1:1 ratio) may be achieved by growing the layer 20 by MOVPE at 1060° C. and 200 Torr on a patterned mask of $Si_xN_y$ stripes having a stripe width of $10\mu$, a window length of $25\mu$ and a period of $35\mu$ for a fill factor of 0.71. The N/Ga ratio during growth of the layer 20 is preferably about 2500. It will be appreciated that other ratios, including ratios greater than 4.2:1, may be achieved through selection of other growth parameters.

Figure 6:
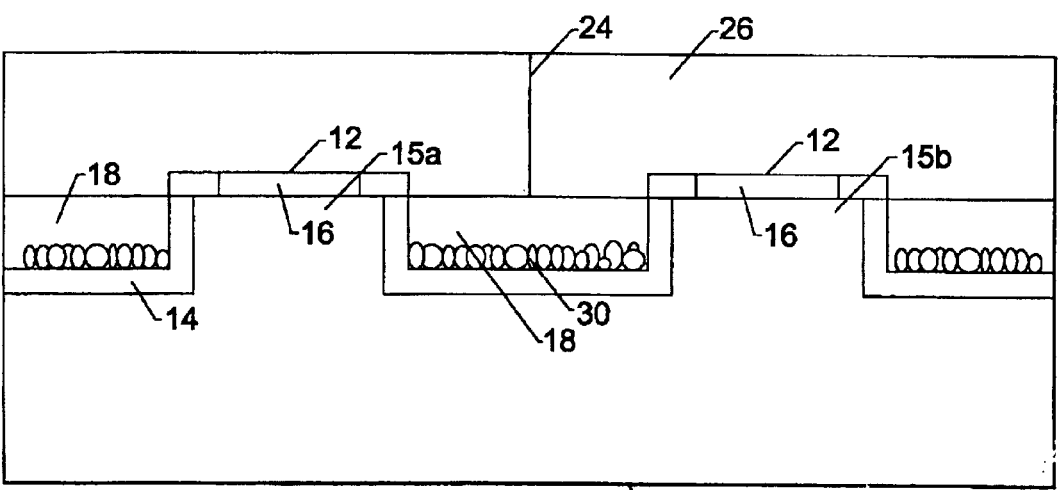
FIG. 6 is a cross section of a substrate on which a layer of GaN has been epitaxially grown in accordance with another aspect of the present invention.

An embodiment of the present invention utilizing pendeoepitaxial growth is illustrated in FIG. 6. In this embodiment, the substrate 10 is etched to form at least one raised portion 15, which defines adjacent recessed areas or trenches 18 on the substrate 10. FIG. 6 illustrates an embodiment in which a pair of raised portions 15a, 15b have been patterned using standard photolithographic techniques and reactive ion etching. Preferably, the height of raised portions 15 (i.e. the depth of trenches 18) is at least $1\mu$. A mask layer 14, which may be $Si_xN_y$, $SiO_2$ or any other suitable mask is then deposited on the upper surface of substrate 10, with mask openings 16 made on the upper surfaces of raised portions 15a, 15b.

In this embodiment, the substrate 10 may be silicon carbide, sapphire, silicon, gallium arsenide, gallium nitride or another Group III-nitride such as aluminum nitride or aluminum gallium nitride. The fabrication of aluminum nitride substrates is described in U.S. Pat. Nos. 5,858,086 and 5,954,874 to Hunter, the disclosures of which are hereby incorporated herein by reference. Gallium nitride substrates have been fabricated by growing thick epitaxial layers of gallium nitride on a non-GaN substrate. Other methods of obtaining gallium nitride substrates are summarized in A. Usui, et al., "Thick GaN epitaxial growth with low dislocation density by hydride vapor phase epitaxy," Jpn. J. Appl. Phys. Vol. 36, pp. L899–902 (1997). It will be appreciated by those of skill in the art that when the substrate is a Group III-nitride, homoepitaxial growth may be used.

As shown in FIG. 6, if a buffer layer is required, an AlGaN buffer layer 12 may be grown vertically from the mask openings (or windows) 16 using MOVPE. In a preferred embodiment, the buffer layer 12 is grown to a thickness larger than the thickness of the mask layer 14. Once the buffer layer 12 has been grown to a desired thickness, the pendeoepitaxial layer 26 is then grown. Pendeoepitaxial layer 26 grows laterally (i.e. parallel to the face of the substrate) over trenches 18 in addition to vertically.

Although nucleation and growth of polycrystalline GaN 30 may be occurring on the mask 14, it is occurring within trenches 18, and thus does not interfere with the lateral growth of pendeoepitaxial layer 26.

Figure 12:
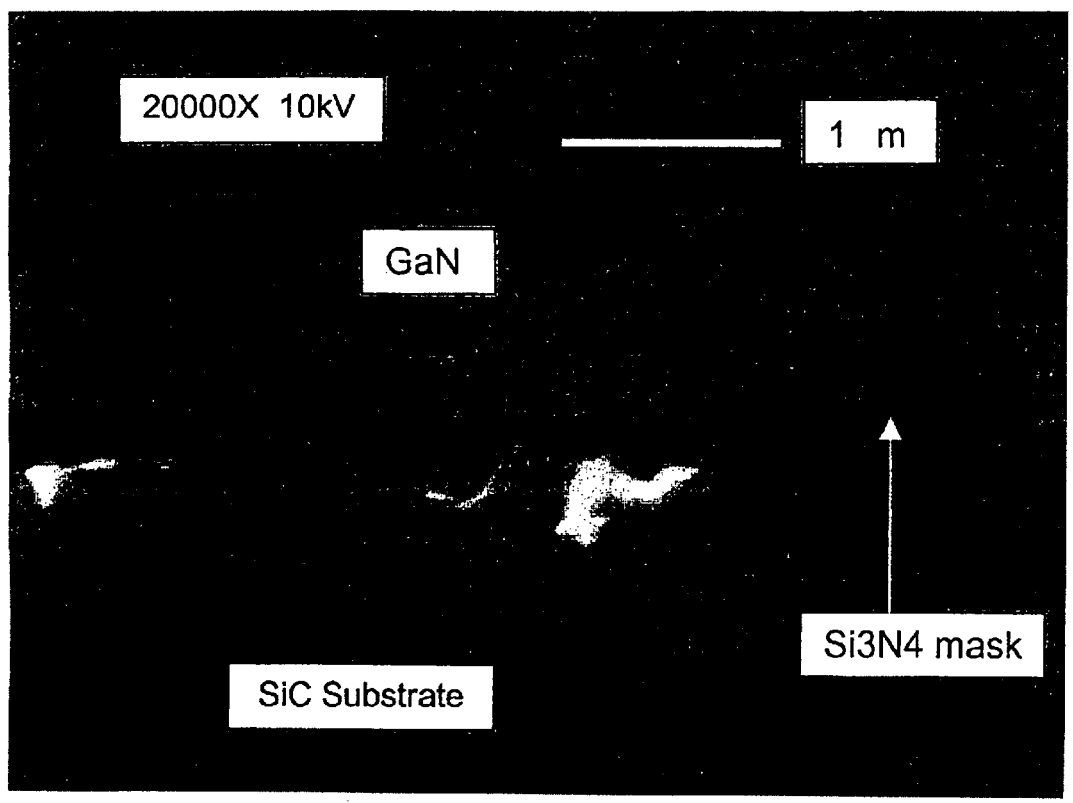
FIG. 12 is a cross sectional SEM of a GaN layer grown in accordance with a second embodiment of the present invention.

FIG. 12 is a cross sectional SEM of a pendeoepitaxial GaN layer grown in accordance with this embodiment of the invention. Polycrystalline AlGaN material is evident within the trench, but does not interfere with the lateral growth of the GaN layer.

It will be readily appreciated that a trench depth of $1\mu$ is exemplary. Trenches 18 may be fabricated with depths less than or greater than $1\mu$ if desired or necessary depending on the rate of polycrystalline growth on the mask or the width of the pendeoepitaxial layer to be grown.

In one embodiment, pendeoepitaxial layer 26 grows laterally until opposing growth fronts 22 coalesce at interfaces 24 to form a continuous layer 26 of gallium nitride. However, as mentioned above, it is not necessary for the growth fronts 22 to coalesce for all applications, as it is possible to fabricate devices in laterally overgrown portions of GaN even if they have not coalesced with adjacent portions.

Figure 13:
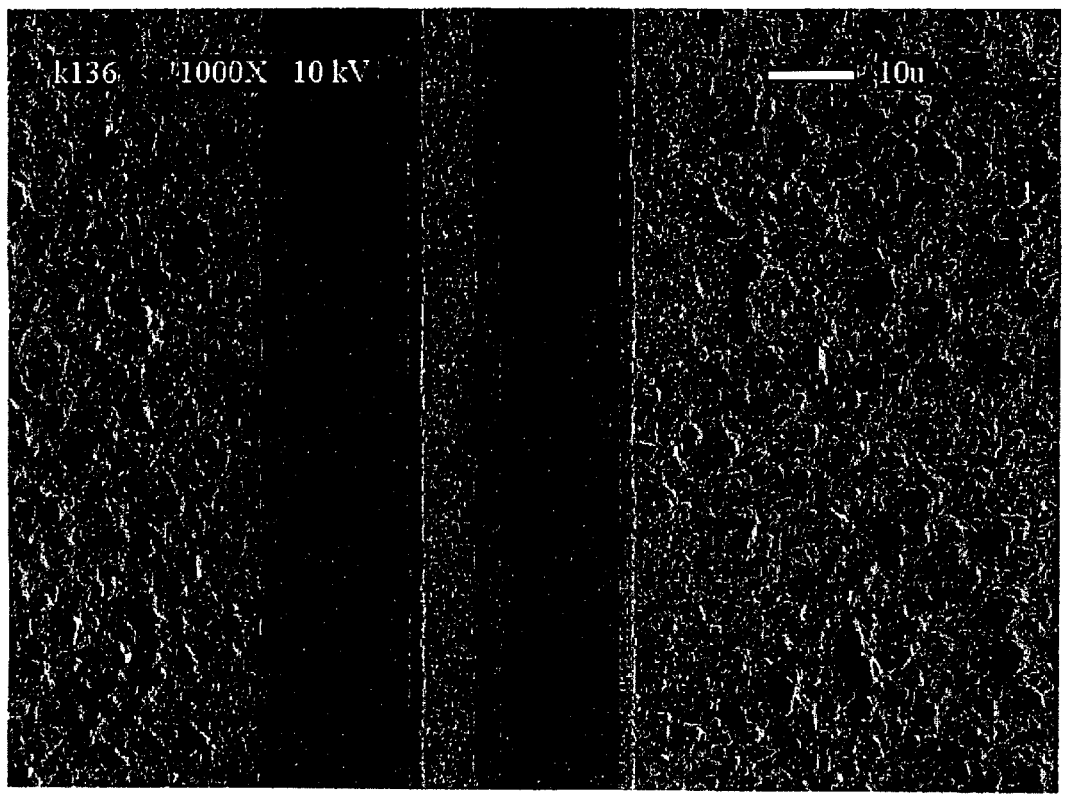
FIG. 13 is a plan view SEM image of two GaN stripes grown in accordance with the second embodiment of the present invention.

FIG. 13 is a plan view SEM image of two pendeoepitaxial GaN stripes grown in accordance with this embodiment of the present invention.

Figure 6A:
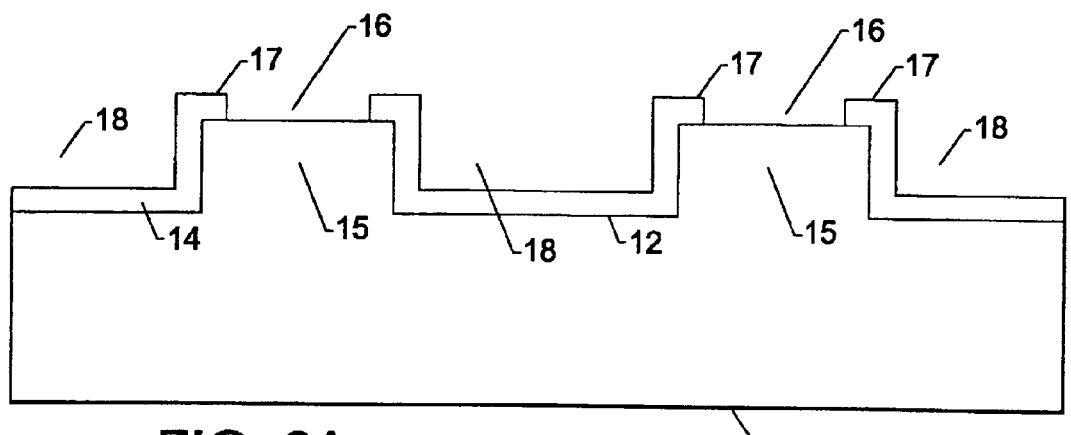
FIG. 6A is a cross section of a substrate on which a pair of raised portions has been formed and a mask layer has been deposited.
Figure 6B:
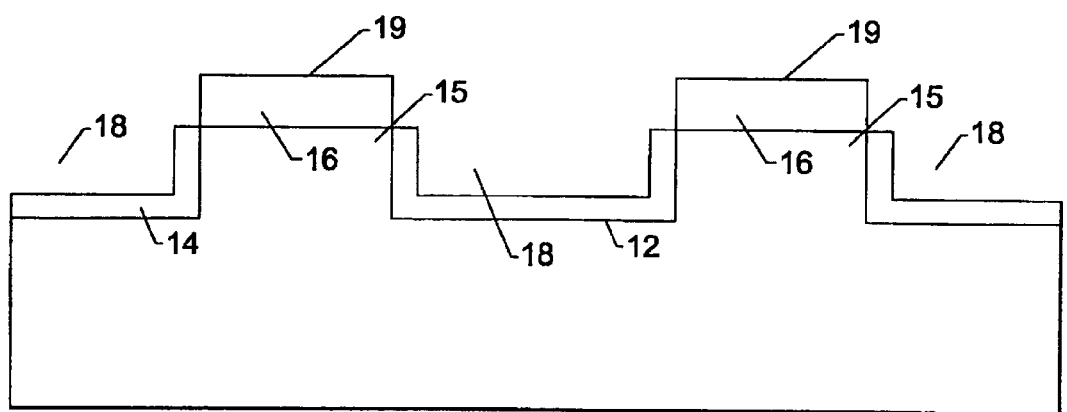
FIG. 6B is a cross section of a substrate on which a pair of raised portions has been formed and a mask layer has been deposited using a self-alignment technique.

For the embodiment illustrated in FIG. 6, alternative methods of forming the mask layer 14 are illustrated in FIGS. 6A and 6B. As discussed above, raised portions 15 may be formed using standard etching techniques. Typically, this involves patterning the surface of a substrate with an etch mask, etching the substrate to the desired depth, and then removing the etch mask. As shown in FIG. 6A, after the etch mask has been removed, the mask layer 14 may be formed on the surface of substrate 10 by PECVD. Windows 16 are then opened in mask 14 to reveal the upper surfaces of raised portions 15.

Because of the tolerance limitations of photolithographic techniques, when the windows 16 are opened in mask 14, it is difficult to align the edges of windows 16 with the edges of raised portions 15. Thus, there is some overlap 17 of the mask 14 onto the upper surfaces of raised portions 15.

A simplified method of forming mask 14 is illustrated in FIG. 6B. In this method, an etch mask 19 is applied to the surface of substrate 10, and substrate 10 is etched to form trenches 18. Mask 14 is deposited after etching trenches 18 but prior to removing etch mask 19. In this technique, mask 14 preferably comprises a thin mask layer of about 50–200 Å in thickness. Mask 14 may comprise $Si_xN_y$, $SiO_2$, or any other suitable mask material. Etch mask 19 is then removed, revealing the upper surfaces of raised portions 15. The edges of windows 16 in mask 14 are thereby self-aligned with the edges of raised portions 15. Thus, with this technique, only a single masking step is required and it is not necessary to use photolithographic techniques to open windows 16 in mask layer 14.

Figure 7:
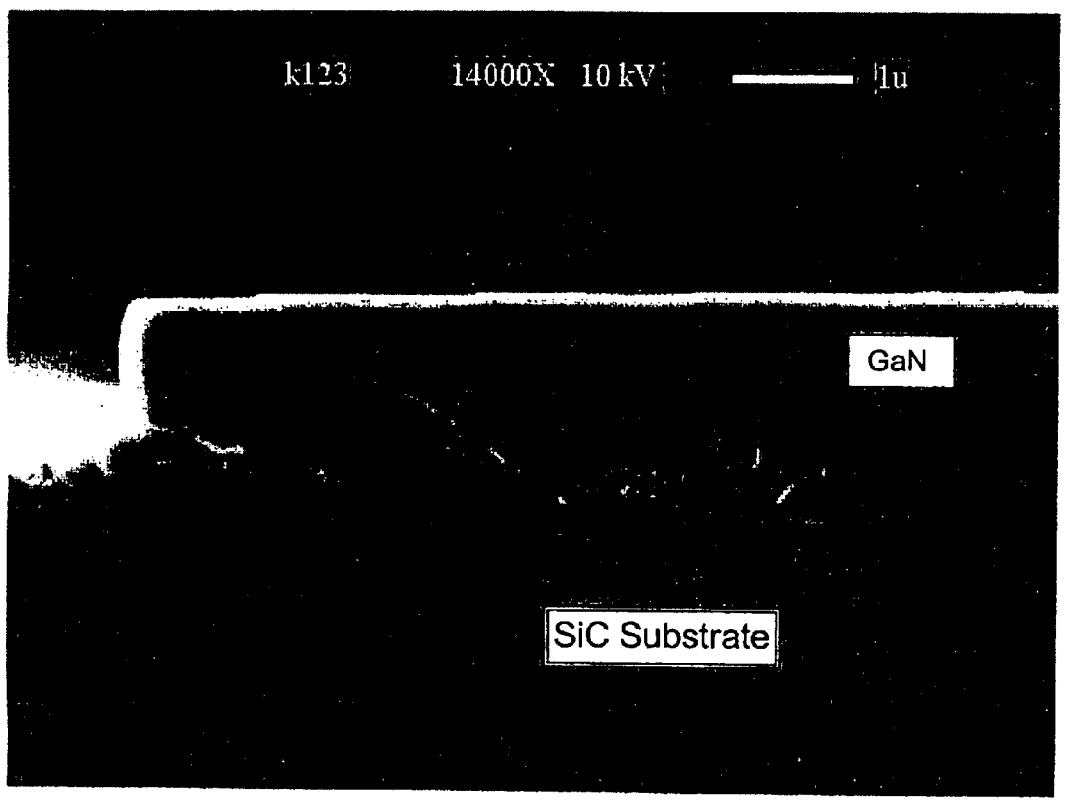
FIG. 7 is a cross-sectional SEM image showing the interruption of lateral growth of a GaN layer by crystals nucleating on the mask.

FIG. 7 is a cross-sectional SEM image showing the interruption of lateral growth of a GaN layer by crystals nucleating on the mask.

Figure 8:
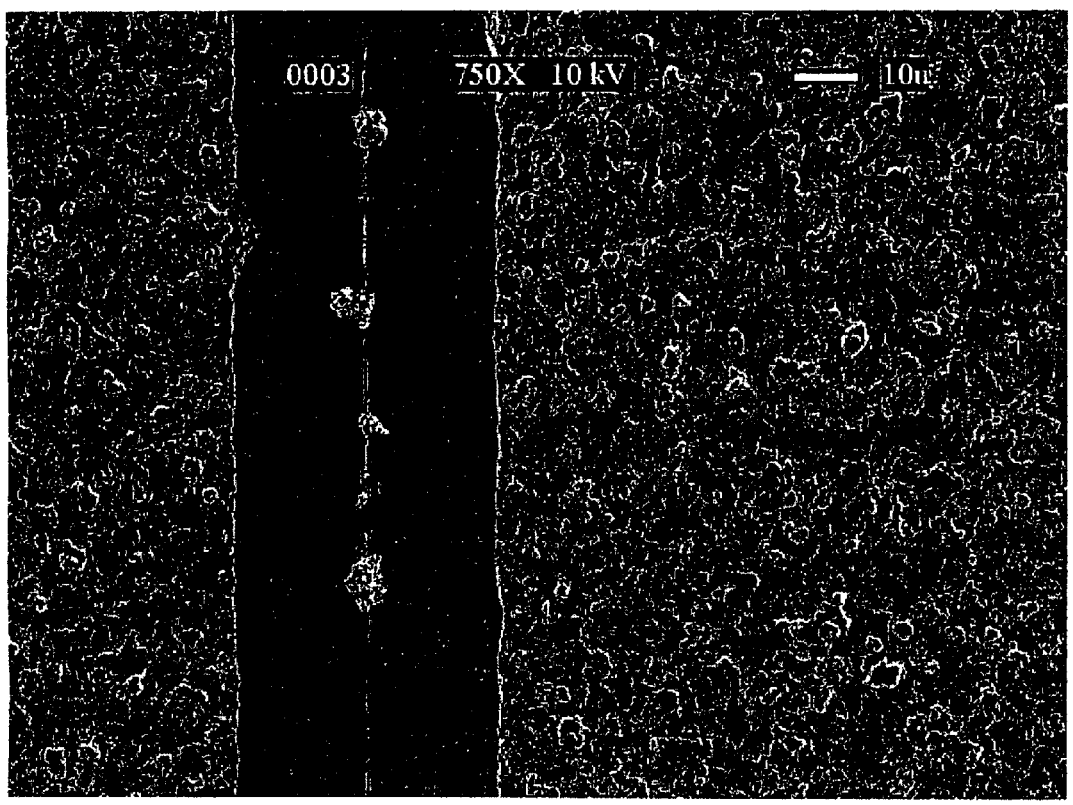
FIG. 8 is a plan view SEM image of two GaN stripes in which crystallites on the underlying mask disturbed the epitaxial growth.

FIG. 8 is a plan view SEM image of two GaN stripes in which crystallites on the underlying mask disturbed the epitaxial growth.

FIG. 9 is a cross-sectional SEM of GaN stripes grown in accordance with an embodiment of the present invention using a reflector mask layer.

Figure 10:
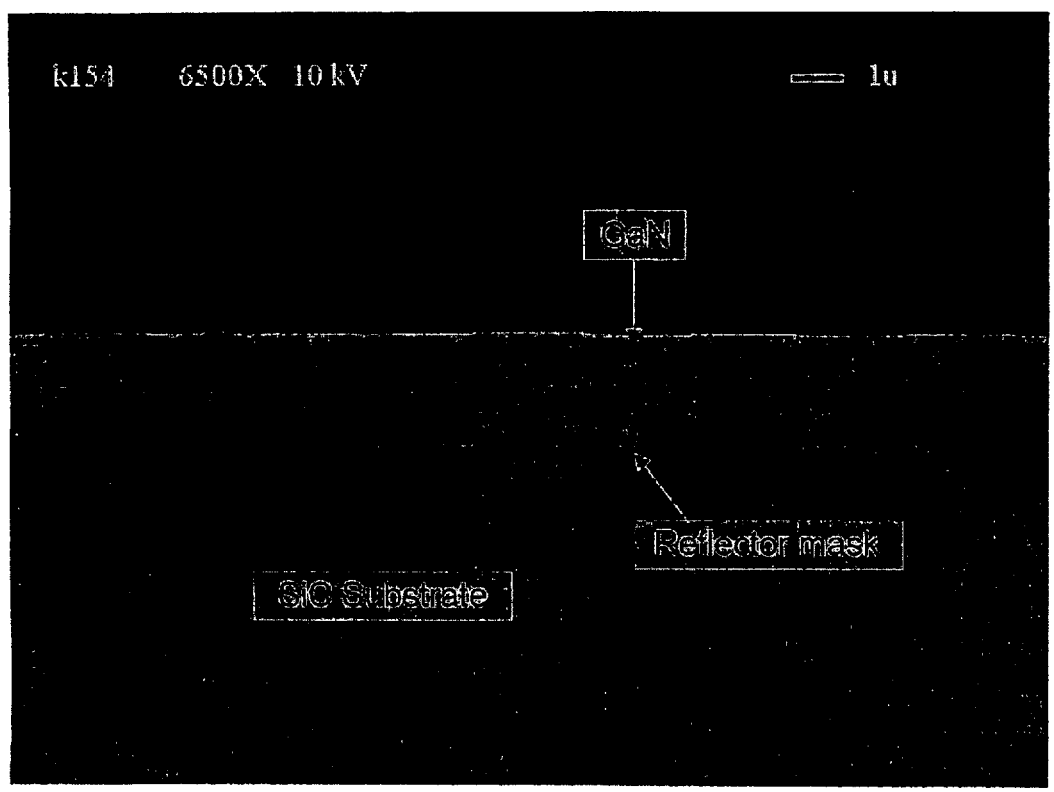
FIG. 10 is a cross-sectional SEM of GaN stripes grown in accordance with an embodiment of the present invention until adjacent regions have coalesced over the reflective masks.

FIG. 10 is a cross-sectional SEM of GaN stripes grown in accordance with an embodiment of the present invention until adjacent regions have coalesced over the masks.

Figure 11:
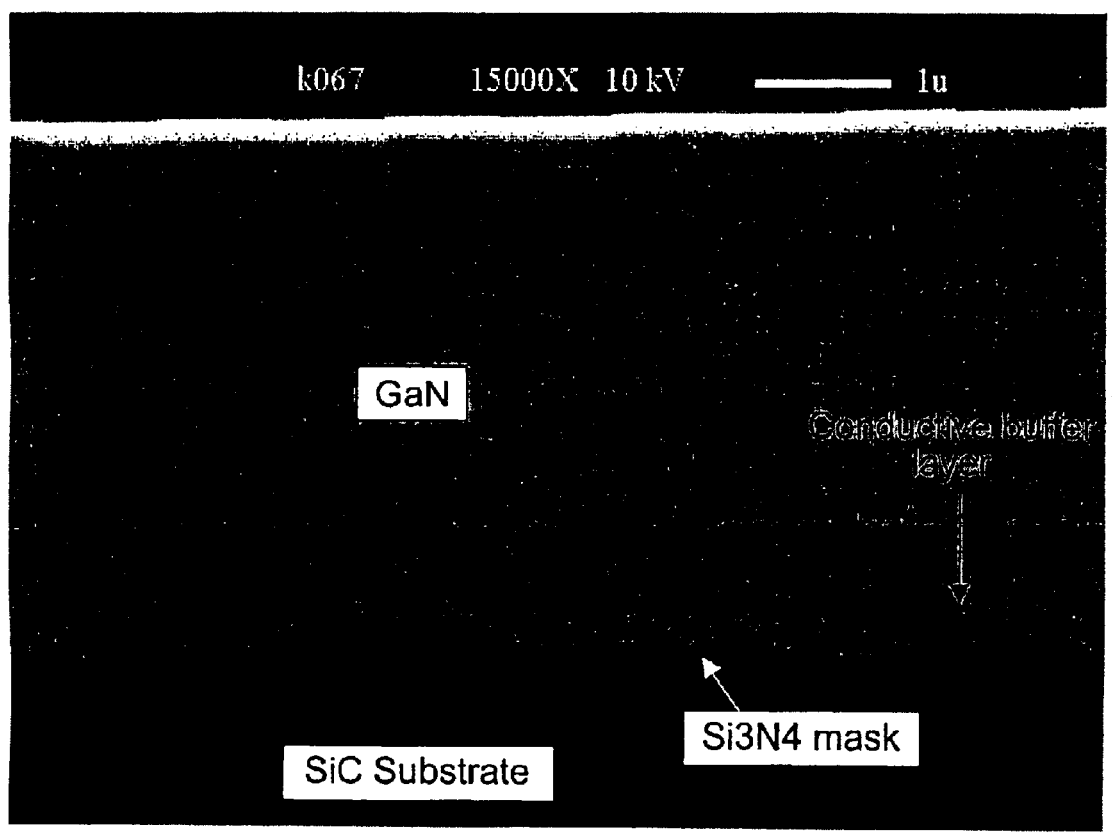
FIG. 11 is a cross-sectional SEM of a GaN layer grown on a conductive buffer layer over a $Si_3N_4$ mask.

FIG. 11 is a cross-sectional SEM of a GaN layer grown on a conductive buffer layer over a $Si_3N_4$ mask.

Figure 14:
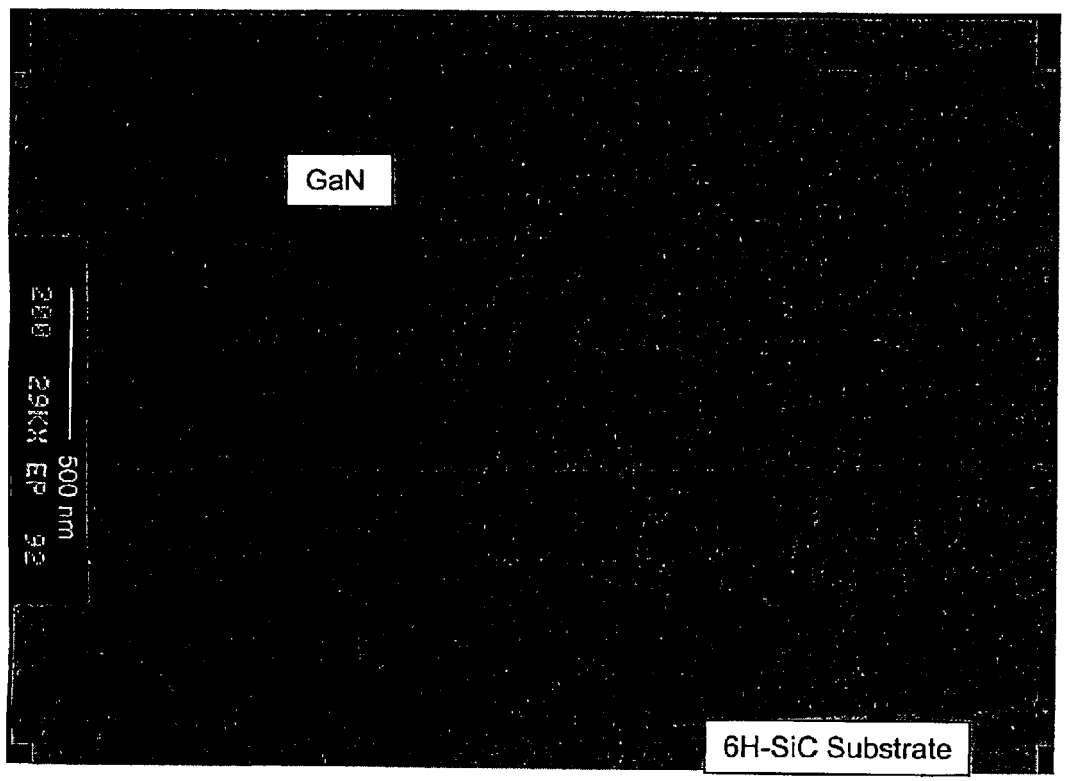
FIG. 14 is a cross-sectional TEM (Transmission Electron Microscopy) image of a layer of GaN grown in accordance with the present invention.

FIG. 14 is a cross-sectional TEM (Transmission Electron Microscopy) image of a layer of GaN grown in accordance with the present invention. The defect densities observed indicate an estimated reduction from approximately $10^9/cm^2$ in the regions over the windows to approximately $10^6/cm^2$ in the regions above the mask stripes.

EXAMPLE 1

Figure 15:
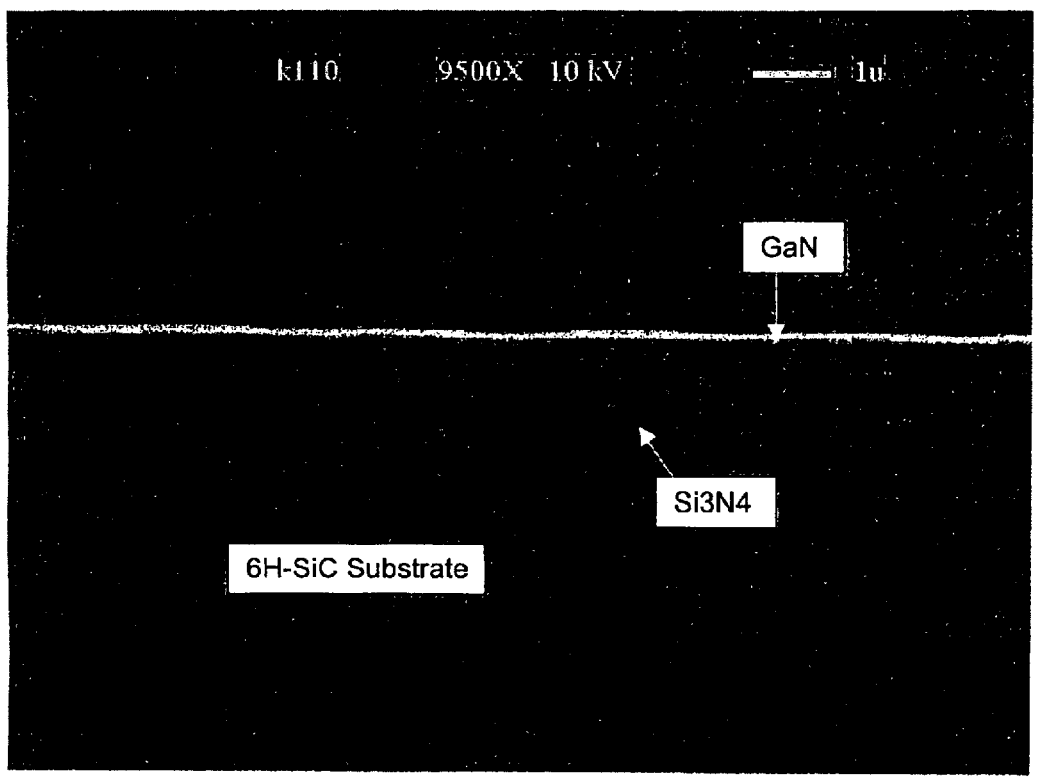
FIG. 15 is a cross-sectional SEM of GaN stripes grown in accordance with an embodiment of the present invention while maintaining a ratio of lateral to horizontal growth rates of 4.2:1.

A patterned mask of $Si_xN_y$ stripes having a stripe width of 10μ, a window length of 25μ and a period of 35μ for a fill factor of 0.715 was applied to a 6H—SiC substrate. The stripes were arranged parallel to the <1$\bar{1}$00> direction. A 0.5μ thick $Al_{0.1}Ga_{0.9}N$ buffer layer was grown by MOVPE by flowing TMG at 34.8 μmol/min, TMA at 6.5 μmol/min and ammonia at 10 slpm in a diluent of $H_2$ at 15.5 slpm at 1020° C. and 76 Torr for a total of 80 minutes. Following growth of the buffer layer, an epitaxial layer of GaN was grown by MOVPE by flowing TMG at 309 μmol/min and ammonia at 17 slpm in a diluent of $H_2$ at 22.5 slpm at 1110° C. and 200 Torr for 45 minutes. The ratio of lateral to vertical growth under these conditions was approximately 4.2:1. FIG. 15 is an SEM image a cross section of the resulting GaN layer.

EXAMPLE 2

Figure 16:
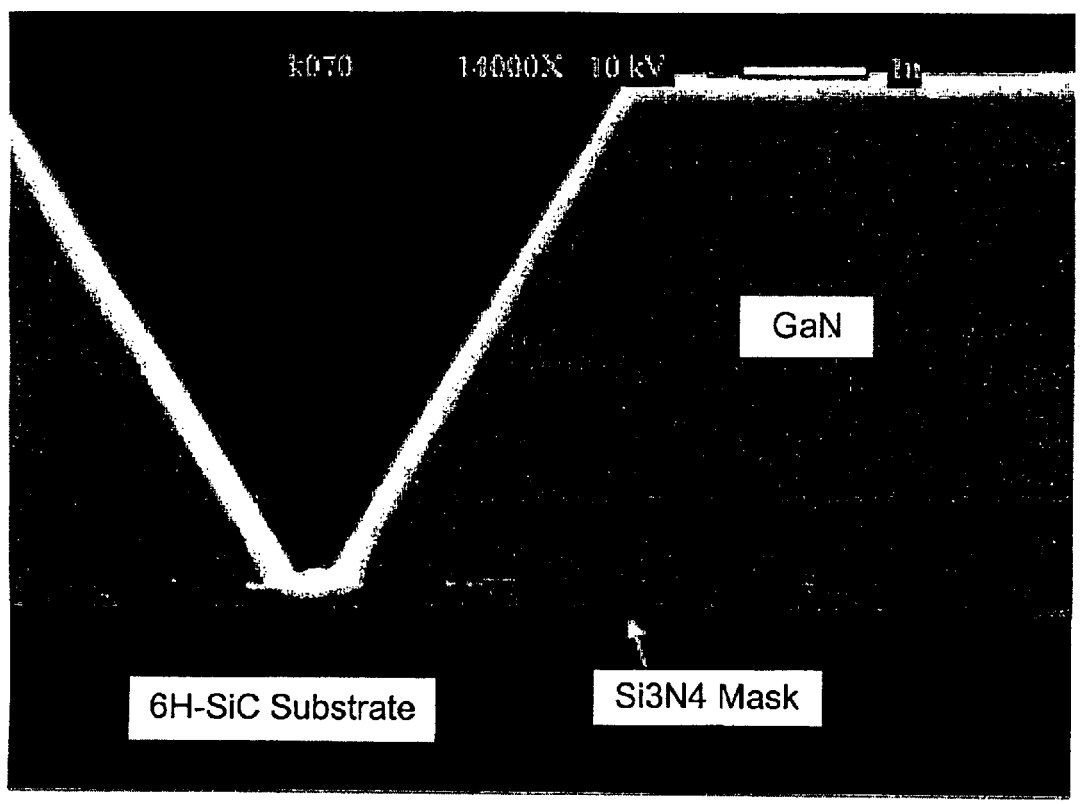
FIG. 16 is a cross-sectional SEM of GaN stripes grown in accordance with an embodiment of the present invention while maintaining a ratio of lateral to horizontal growth rates of 1:1.

A patterned mask of $Si_xN_y$ stripes having a stripe width of 10μ, a window length of 25μ and a period of 35μ for a fill factor of 0.715 was applied to a 6H—SiC substrate. The stripes were arranged parallel to the <1$\bar{1}$00> direction. A 0.5μ thick $Al_{0.1}Ga_{0.9}N$ buffer layer was grown by MOVPE by flowing TMG at 34.8 μmol/min, TMA at 6.5 μmol/min and ammonia at 10 slpm in a diluent of $H_2$ at 15.5 slpm at 1050° C. and 76 Torr for a total of 80 minutes. Following growth of the buffer layer, an epitaxial layer of GaN was grown by MOVPE by flowing TMG at 309 μmol/min and ammonia at 17 slpm in a diluent of $H_2$ at 22.5 slpm at 1060° C. and 200 Torr for one hour. The ratio of lateral to vertical growth under these conditions was approximately 1:1. FIG. 16 is an SEM image a cross section of the resulting GaN layer.

In the specification and drawings, there have been set forth preferred and exemplary embodiments of the invention which have been included by way of example and not by way of limitation, the scope of the invention being set forth in the accompanying claims.

What is claimed is:

1. A method of fabricating a gallium nitride-based semiconductor structure on a substrate, the method comprising:

forming a mask having an opening on said substrate;

growing an epitaxial layer selected from the group consisting of gallium nitride and Group III nitride alloys of gallium nitride vertically from the opening and laterally across the mask; and maintaining the lateral growth rate of said epitaxial layer at a rate sufficient to prevent polycrystalline nitride material nucleating on the mask from interrupting the lateral growth of said epitaxial layer.

2. A fabrication method according to claim 1 comprising maintaining the lateral growth rate greater than the vertical growth rate.

3. A fabrication method according to claim 1 comprising maintaining the ratio of the lateral growth rate to the vertical growth rate greater than about 1:1.

4. A fabrication method according to claim 1 comprising maintaining the ratio of the lateral growth rate to the vertical growth rate at between about 1:1 and 4.2:1.

5. A fabrication method according to claim 1 comprising maintaining the ratio of the lateral growth rate to the vertical growth rate greater than about 4.2:1.

6. A fabrication method according to claim 3 comprising maintaining the lateral growth rate at between about 2 and 8 microns per hour.

7. A fabrication method according to claim 1 wherein the substrate comprises silicon carbide.

8. A fabrication method according to claim 1, further comprising:

growing a buffer layer through the opening in the mask, wherein said buffer layer will support the epitaxial growth of Group III nitrides thereon.

9. A fabrication method according to claim 8 wherein the step of growing the buffer layer comprises growing a layer of $Al_xGa_{1-x}N$ where $0 \leq x \leq 1$.

10. A fabrication method according to claim 9 wherein the buffer layer forms a conductive interface to the substrate.

11. A method of fabricating a gallium nitride-based semiconductor structure on a substrate, the method comprising:

forming a mask having an opening therein on a substrate;

growing an epitaxial layer selected from the group consisting of gallium nitride and Group III nitride alloys of gallium nitride vertically from the opening and laterally across the mask under conditions such that polycrystalline nitride material is not inhibited from nucleating on the mask;

wherein the laterally growing epitaxial layer overgrows the polycrystalline nitride material.

12. A fabrication method according to claim 11 comprising maintaining the lateral growth rate greater than the vertical growth rate.

13. A fabrication method according to claim 11 comprising maintaining the ratio of the lateral growth rate to the vertical growth rate greater than about 1:1.

14. A fabrication method according to claim 11 comprising maintaining the ratio of the lateral growth rate to the vertical growth rate at between about 1:1 and 4.2:1.

15. A fabrication method according to claim 11 comprising maintaining the ratio of the lateral growth rate to the vertical growth rate greater than about 4.2:1.

16. A fabrication method according to claim 13 comprising maintaining the lateral growth rate at between about 2 and 8 microns per hour.

17. A fabrication method according to claim 11 wherein growth of the epitaxial layer is performed at about 1060 to 1120° C.

18. A fabrication method according to claim 11 comprising forming the mask on a silicon carbide substrate.

19. A fabrication method according to claim 18 comprising forming a striped mask oriented along the <1100> direction on the (0001) surface of the SiC substrate.

20. A fabrication method according to claim 11, further comprising:

growing a buffer layer through the opening in the mask, wherein said buffer layer will support the epitaxial growth of Group III nitrides thereon.

21. A fabrication method according to claim 20 wherein the step of growing the buffer layer comprises growing a layer of $Al_xGa_{1-x}N$ where $0 \leq x \leq 1$.

22. A fabrication method according to claim 21 wherein the buffer layer forms a conductive interface to the substrate.

23. A fabrication method according to claim 20 comprising growing the buffer layer to a thickness greater than the thickness of the mask.

24. A fabrication method according to claim 11 comprising growing the epitaxial layer by vapor phase epitaxy using one or more source gases selected from the group consisting of trimethyl gallium, trimethyl aluminum, and ammonia.

25. A fabrication method according to claim 11 comprising forming a mask that includes a plurality of openings and growing the buffer and epitaxial layers from a plurality of the openings.

26. A fabrication method according to claim 25 comprising growing the epitaxial layer until laterally growing portions coalesce.

27. A method of fabricating a gallium nitride-based semiconductor structure on a substrate, the method comprising:

forming a mask having at least two openings therein on a substrate;

growing a buffer layer on the substrate within the openings in the mask; and growing an epitaxial layer selected from the group consisting of gallium nitride and Group III nitride alloys of gallium nitride upwardly from the buffer layer and laterally across the mask;

while maintaining the horizontal growth rate of the gallium nitride layer at a rate sufficient to prevent polycrystalline material nucleating on the mask from interrupting the lateral growth of the gallium nitride layer until the lateral growth from the openings coalesces; and thereafter continuing to grow the epitaxial layer vertically.

28. A fabrication method according to claim 27, further comprising:

after the lateral growth from the openings coalesces, increasing the rate of vertical growth of the coalesced epitaxial layer.

29. A fabrication method according to claim 27 comprising maintaining the lateral growth rate greater than the vertical growth rate.

30. A fabrication method according to claim 29 comprising maintaining the ratio of the lateral growth rate to the vertical growth rate greater than about 1:1.

31. A fabrication method according to claim 29 comprising maintaining the ratio of the lateral growth rate to the vertical growth rate at between about 1:1 and 4.2:1.

32. A fabrication method according to claim 29 comprising maintaining the ratio of the lateral growth rate to the vertical growth rate greater than about 4.2:1.

33. A fabrication method according to claim 30 comprising maintaining the lateral growth rate at between about 2 and 8 microns per hour.

34. A fabrication method according to claim 27 comprising masking the substrate using a technique selected from the group consisting of plasma-enhanced chemical vapor deposition, sputtering, reactive sputtering, electron-beam deposition and thermal oxidation.

35. A fabrication method according to claim 27 comprising masking a SiC substrate.

36. A fabrication method according to claim 27 wherein the step of growing the buffer layer comprises growing a layer of $Al_xGa_{1-x}N$ where $0 \leq x \leq 1$.

37. A fabrication method according to claim 36 wherein the buffer layer forms a conductive interface to the substrate.

38. A fabrication method according to claim 36 comprising growing the buffer layer by vapor phase epitaxy using trimethyl gallium, trimethyl aluminum, and ammonia as the source gases.

39. A fabrication method according to claim 27 comprising growing the buffer layer to a thickness greater than the thickness of the mask.

40. A fabrication method according to claim 27 comprising growing the epitaxial layer by vapor phase epitaxy using one or more source gases selected from the group consisting of trimethyl gallium, trimethyl aluminum, and ammonia.

* * * * *